Feb. 24, 1959 I. A. PAUL ET AL 2,875,329

AUTOMATIC TUNING SYSTEMS

Filed Dec. 28, 1955 2 Sheets-Sheet 1

INVENTORS
ISRAEL A. PAUL
ALAN H. GREENE
BY R. V. Braddock
ATTORNEY

INVENTORS
ISRAEL A. PAUL
ALAN H. GREENE
BY
R. V. Craddock
ATTORNEY

United States Patent Office 2,875,329

Patented Feb. 24, 1959

2,875,329

AUTOMATIC TUNING SYSTEMS

Israel A. Paul, Merrick, N. Y., and Alan H. Greene, Haddonfield, N. J., assignors to Sperry Rand Corporation, a corporation of Delaware Application December 28, 1955, Serial No. 555,910

9 Claims. (Cl. 250—20)

This invention relates to improvements in automatic tuning systems, and more particularly to apparatus for operating a tunable radio device in such manner as to search for and lock on a signal which may occur at any frequency within a wide band. Automatic frequency control systems of the general type to which this invention relates are well known, and are used, for example, in radar systems to adjust the local oscillator in the radar receiver to compensate for unavoidable variations in the operating frequency of the transmitter. Such frequency control systems usually are required to search only over a relatively narrow band which can be covered by electronic tuning, as by varying the voltage applied to the reflector electrode of a reflex klystron. In certain applications of automatic tuning a much wider band must be searched, and it is necessary to resort to mechanically operated tuning means such as an adjustable resonator having a moving part, for example, a plunger, that is driven by a motor.

Motor driven automatic tuning systems ordinarily are slow in operation, and tend to be unstable owing to backlash in the mechanical connections and zero drift in the amplifier that energizes the motor.

The principal object of the present invention is to provide an automatic tuning control system of the motor driven type which is substantially faster-acting than prior systems of said type.

Another object is to provide an improved system of the above-mentioned type wherein zero drift is minimized.

A further object is to provide an automatic tuning system that is particularly adapted for radio receivers using microwave signals that are pulsed.

Another object is to provide a system of the described type wherein the effects of variation in the characteristics of the component elements such as vacuum tubes are minimized.

Another object is to provide simple and effective means for stabilizing a motor-driven tuning control system.

According to this invention, the system is arranged to permit tuning to frequencies both above and below that of the local oscillator, by means of a sensing device that automatically selects the proper tuning control signal polarity to drive the tuning mechanism to a stable null on either image frequency. This allows the system to search a wide frequency band with a minimum range of variation of the local oscillator frequency, and thus minimizes the time required to search the band.

The system is arranged so that most of the necessary amplification takes place in circuits that operate with modulated or pulsed signals, wherein variations in tube characteristics cannot introduce any zero drifts. In a preferred embodiment of the invention an A.-C. motor is used, and a magnetic amplifier circuit operated by grid-controlled gas discharge tubes is arranged to convert pulsed signals from a discriminator into a suppressed-carrier modulated A.-C. signal for energizing the motor.

To prevent hunting as a result of backlash in the tuning drive, the motor control circuit may be arranged to have a dead space in its response characteristic, whereby a certain minimum amount of detuning must exist before the motor will be energized. According to one presently preferred method of stabilization, the magnitude of this dead space is controlled as a function of the motor control voltage. In another method of stabilization, an auxiliary system is arranged to control the local oscillator frequency electronically over a region within the band corresponding to the dead space of the motor control system.

The invention will be described with reference to the accompanying drawings, wherein.

Figure 1:
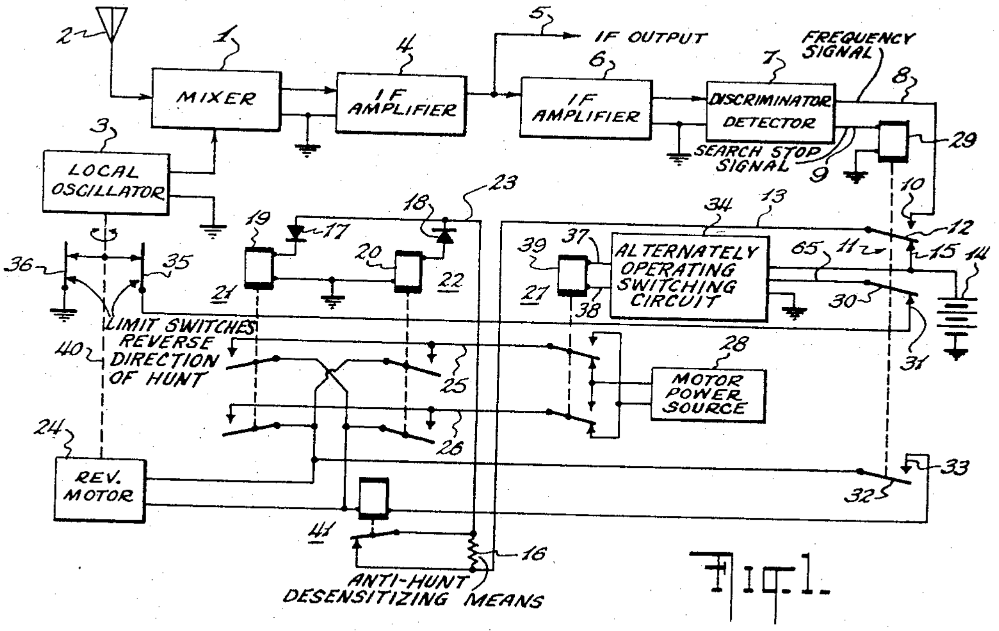
Fig. 1 is a schematic block diagram of a tuning control system embodying the invention applied to the local oscillator of a microwave receiver system.

Referring to Fig. 1, a mixer 1 is connected to an antenna 2 and a local oscillator 3 which respectively supply it with received and beating signals for conversion to intermediate frequency signals. The mixer output terminals are coupled to an I.-F amplifier 4. The output of amplifier 4 may be coupled by way of a conductor 5 to utilization means such as a second detector and an indicator system, not shown. The amplifier 4 is also coupled through a second I.-F. amplifier 6, whose principal function is that of a buffer, to a discriminator-detector circuit 7.

The discriminator-detector 7 is designed as will be further described below to provide two separate outputs. The first output, which appears on the wire 8, varies in magnitude and polarity as a function of the frequency of the input to the circuit 7, in the manner shown in Fig. 3. It will be seen that this a typical discriminator characteristic, representing output of zero amplitude at the center frequency $f_0$, first increasing in magnitude with departure from the center frequency, then decreasing again to approximately zero at the lower and upper frequencies $f_1$ and $f_2$, with one polarity between $f_1$ and $f_0$ and the opposite polarity between $f_0$ and $f_2$. The second output of the discriminator-detector 7, which appears on wire 9, varies in magnitude as a function of frequency in the manner shown in Fig. 6. Throughout most of the range between $f_1$ and $f_2$, the magnitude is finite and is substantially independent of frequency. Below $f_1$ and above $f_2$, the magnitude decreases to zero.

The first output of device 7 is supplied by wire 8 to a contact 10 of a double throw switch assembly 11. A switch arm 12 is arranged to selectively connect a wire 13 either to the wire 8 by way of contact 10, or to a bias source such as a battery 14, by way of a contact 15. The wire 13 is connected through a resistor 16, wire 23, and rectifiers 17 and 18 respectively to the actuating coils 19 and 20 of a pair of electromagnetic switches or relays generally designated as 21 and 22. The rectifiers 17 and 18 are poled oppositely, so that a positive voltage on the wire 23 will energize the relay 21 but not the relay 22, while a negative voltage will energize the relay 22 but not the relay 21.

The relays 21 and 22 are provided with respective contact assemblies connected as shown between a reversible motor 24 and a pair of wires 25 and 26, which are in turn connected through a reversing switch 27 to a power source 28. The arrangement and interconnection of the contacts of relays 21 and 22 are such that when relay 21 is energized, one terminal of the motor 24 is connected to the wire 25 and the other terminal is connected to the wire 26. When relay 22 is energized, the connections of the motor to the wires 25 and 26 are reversed When neither relay is energized, both motor terminals are disconnected.

The motor 24 is of a type wherein the direction of rotation depends upon the sense or polarity of its connection to the source 28. Thus the direction of rotation is determined jointly by the position of the reversing switch 27 and by which of the relays 21 and 22 is energized.

The second output of the discriminator-detector device 7 is supplied by wire 9 to the coil 29 of an electromagnet which is arranged to actuate the switch 11. The switch 11 includes an additional pair of contacts 30 and 31 that are arranged to be open when the magnet 29 is energized, and a further pair of contacts 32 and 33 that are closed when the magnet 29 is energized.

An alternately operating switching circuit 34 is connected so as to be energized from the source 14 by way of the contacts 30 and 31 and a pair of limit switches 35 and 36. The counter 34 may be any device having two stable conditions, one resulting in output at its terminals 37 and 38 and the other resulting in no output, which is capable of switching alternately from one of its conditions to the other each time it is energized. The terminals 37 and 38 are connected to the coil 39 of an electromagnet which is arranged to actuate the reversing switch 27. Thus, each time the input circuit of the counter through the switch 30, 31 and limit switches 35 and 36 is re-closed after having been opened, the switch 27 will be operated to reverse the connections of the source 28 to the wires 25 and 26.

The shaft of the motor 24 is coupled by means schematically indicated by the dash line 40 to mechanism for adjusting the frequency of the oscillator 3. Limit switches 35 and 36 are arranged so that whenever the tuning mechanism reaches either limit of its operating range, one of the switches will be opened momentarily.

The resistor 16 is connected to the contacts of a relay 41 so that when the relay is deenergized, the resistor is short circuited. The coil of the relay 41 is connected by way of contacts 32 and 33 of the relay 11 to the input terminals of the motor 24. Thus when either the motor 24 or the coil 29 is deenergized, the resistor 16 is short circuited.

In the operation of the system of Fig. 1, assuming that the system is not already tuned to a signal being received, all of the relays and switches will be initially in the positions shown in the drawing, except the reversing switch 27, which could be initially in either position. When the system is turned on, by connecting the power supplies including the motor source 28 and the battery 14, the coil 19 of relay 21 is immediately energized and the motor 24 starts to run, driving the tuning mechanism to search for a received signal.

If no signal appears before the limit of the tuning range in that particular direction is reached, the corresponding limit switch 35 or 36 is opened momentarily, breaking and then re-closing the ground return of the input circuit of the alternately operating switching circuit 34. This makes the switch 27 operate to reverse the connections between the power supply 28 and the motor 24, which then runs in the other direction to search until a signal is tuned in or until the other tuning range limit is reached. In the latter case, the motor will be reversed again, and will continue to run back and forth between the two limits until a signal is received.

When a signal is received at a frequency within the tuning range of the equipment, the motor continues to run until the local oscillator 3 approaches a frequency that differs from the received signal frequency by an amount corresponding to the intermediate frequency, which is approximately the center of the pass band of amplifiers 4 and 6, and specifically is the frequency $f_0$ to which the discriminator-detector 7 is tuned. Note that this condition can arise when the frequency of the local oscillator 3 is either above or below that of the received signal by the amount $f_0$, and that the local oscillator can approach either such frequency from either direction, i. e., while its frequency is being either increased or decreased.

The second output of the discriminator-detector 7, appearing on the wire 9, energizes the coil 29 to operate the switch 11 to its upper position. The wire 13 is disconnected from the source 14, which stops the search operation, and is connected to the wire 8, thus applying the first output of the discriminator-detector 7 to wire 23 and rectifiers 17 and 18. The operation of the switch 11 also opens contacts 30, 31, resetting the counter 34, and closes contacts 32, 33.

Figures 3, 4, 5, 6:
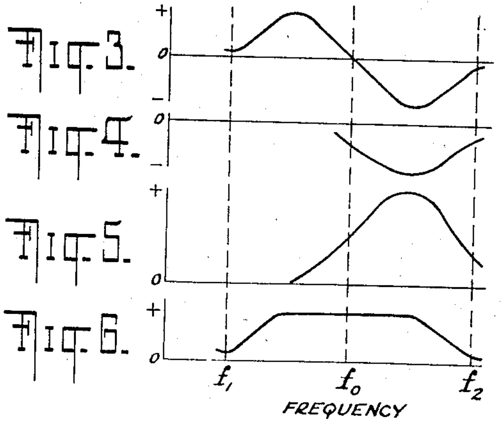
Figs. 3, 4, 5 and 6 are graphs showing the relationships between amplitude and frequency of various voltages that occur in the operation of the circuit of Fig. 2.

If the relationship between the frequencies of the received signal and the local oscillator 3 happen to be such that the I.-F. output of the mixer 1 approaches the frequency $f_0$ from a lower frequency, the voltage on wire 8 and hence on wire 23 will be of positive polarity with respect to ground, as indicated by Fig. 3. The rectifier 17 will conduct, operating the relay 21 to energize the motor 24. Similarly, if the I.-F. output approaches $f_0$ from a higher frequency, the relay 22 will operate. In either event, the direction of rotation of the motor 24 will depend upon the current position of the reversing switch 27, which in turn depends upon which way the motor happened to be running during the last preceding cycle of the search operation.

Suppose that the motor 24 is energized to rotate in such direction as to reduce the difference between the I.-F. output of the mixer and the center frequency $f_0$. Note that this can be either direction, depending upon whether the local oscillator frequency is above or below that of the received signal. In either case, the motor will continue to drive the tuning mechanism to make the I.-F. output of the mixer approach $f_0$. As the first output (Fig. 3) of the discriminator-detector 7 reaches or closely approaches zero, the relay 21 opens and stops the motor.

Now suppose that the condition of the reversing switch 27 were such that the motor were energized to rotate in the direction to increase the difference between the I.-F. output of the mixer and the desired frequency $f_0$. As soon as the mixer output frequency is driven below $f_1$ or above $f_2$ (Fig. 6) as the case may be, the second output of the discriminator-detector 7 falls off and coil 29 is deenergized, actuating the switch 11 to its lower position. This reestablishes the search phase of operation and energizes the alternately operating switching circuit 34, which operates the reversing switch 27.

The motor 24 will then rotate to change the mixer output frequency toward $f_0$, and the system will operate as it would have if the motor had started in the right direction in the first place. As $f_0$ is approached, the coil 29 will be energized again, then relay 21 or 22 will operate, then both relays 21 and 22 will open and the motor will stop.

With any practical construction, there will be some unavoidable irregularity like backlash in the relationship between the position of the motor 24 and the frequency of the oscillator 3. Also the motor and tuning drive mechanism will exhibit inertia effects tending to cause overshooting and hunting. Thus instead of remaining stopped at or close to the null position corresponding to $f_0$, the motor may drive past it, causing first one and then the other of the relays 21 and 22 to be actuated, reversing the motor and repeating the cycle continuously.

The system of Fig. 1 may be stabilized by designing the relay coils 19 and 20, taking into account the gains in the amplifier components of the system, to provide a substantial "dead space," that is, a region extending above and below $f_0$ wherein the discriminator output (Fig. 3) is insufficient to operate either relay 21 or 22. The width of the dead space is made large enough so that the maximum over-run of the motor after it is deenergized will not drive the I.-F. signal out of the dead space.

It is evident that the overall tuning accuracy of the system cannot be better than the deviation allowed by the dead space. Therefore, the amount of dead space required should be reduced as far as possible, by designing the tuning drive mechanism for minimum backlash. The dead space requirement can also be reduced by reducing the servo loop gain of the system, for example, by using a gear train of large step-down ratio between the motor and the tuning mechanism. This expedient is undesirable because the searching speed will be decreased correspondingly. The loop gain may be reduced by simply lowering the motor driving voltage, or using a less powerful motor. This also has the disadvantage of reducing the speed of operation of the system, both in the search and fine tuning control phases.

In the system of Fig. 1, the servo loop gain is effectively reduced as the null is approached by increasing the width of the dead space in response to energization of the motor, during the fine tuning phase of the operation. The system loop gain, including the sensitivity of the relays 21 and 22, is made high enough to provide a relatively narrow dead space. The resistor 16 is such as to reduce the input to the relays 21 and 22 enough to provide a relatively large dead space.

During the search phase of operation, switch contacts 32 and 33 are open, the relay 41 remains deenergized, and the resistor 16 is shorted out. When the fine tuning phase begins, the relay 41 is energized with the motor 24, and the resistor 16 is inserted, reducing the input to the relays 21 and 22. As the null is approached, the relay 21 or 22 will drop out sooner than it would have if the resistor 16 were not in the circuit, deenergizing the motor longer before the null is reached. This also deenergizes the relay 41 which, after a short delay, again cuts out the resistor 16. The relay 21 or 22 may reclose, repeating the cycle and thus energizing the motor in short pulsations, thereby reducing the average torque and speed of the motor and hence the effective loop gain. Finally, the motor will come to rest with the resistor 16 shorted out and the system will be tuned within the limits of the narrow dead space.

This method of stabilization retains the advantages of a narrow dead space while permitting the motor to operate at full power in the presence of large frequency errors and at maximum speed in searching.

Figure 9:
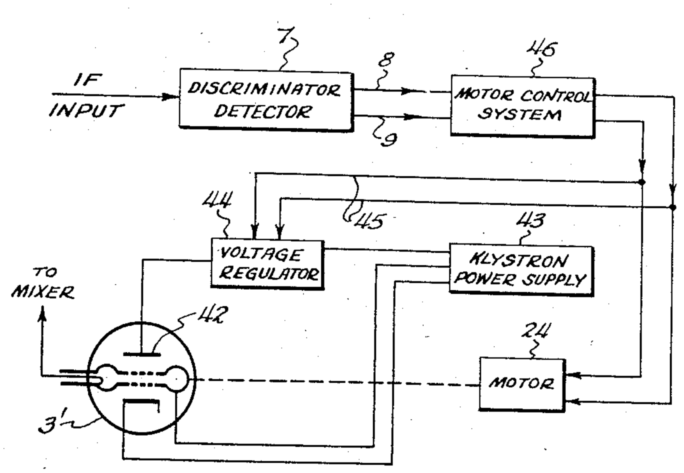
Fig. 9 is a schematic block diagram of part of a tuning control system, illustrating an alternative arrangement for stabilization.

An alternative system for stabilization is illustrated in Fig. 9, wherein the local oscillator 3' is a reflex klystron or other device that may be tuned electronically as well as mechanically. In the reflex klystron, the frequency may be varied within certain limits by varying the negative voltage applied to its reflector electrode 42. A power supply device 43 is connected to the various elements of the tube 3' in normal manner, except that a voltage regulator 44 is included in the connection to the reflector 42. The regulator 44 may be of any type that is adapted to be controlled by a control signal input applied to it by way of wires 45.

As in the system of Fig. 1, a discriminator-detector 7 is coupled to a motor control system, represented in Fig. 9 by the block 46, which is connected to the motor 24. The tuning mechanism of the oscillator 3' is arranged to be driven by the motor 24 as in the system of Fig. 1.

The control input connections 45 of the voltage regulator 44 are coupled to output terminals of the motor control system. The connection may be direct, as indicated, or may include intermediate coupling means such as a phase detector, if the motor 24 is of the A.-C. type. The connections are arranged in the regulator 44 in such manner that a motor control signal that tends to increase the frequency of the oscillator 3' will make the voltage at the reflector electrode 42 more negative, which also tends to increase the frequency, and vice versa.

Within the limited range of its electronic tuning, the frequency of the oscillator 3' can be changed much more rapidly by the control of the reflector voltage than it can be changed by the motor driven mechanical tuner. Owing to its fast response, the electronic tuning system acts to provide lead compensation for the motor control system. The motor tuning operation follows the electronic tuning to place the center of the electronic tuning range inside the dead space. Thereafter the electronic tuning means rapidly compensates any frequency changes of small magnitude, keeping the system within the dead space. Frequency changes too large to be handled by the electronic tuning will cause the motor to run again to center the electronic tuning.

Figure 2:
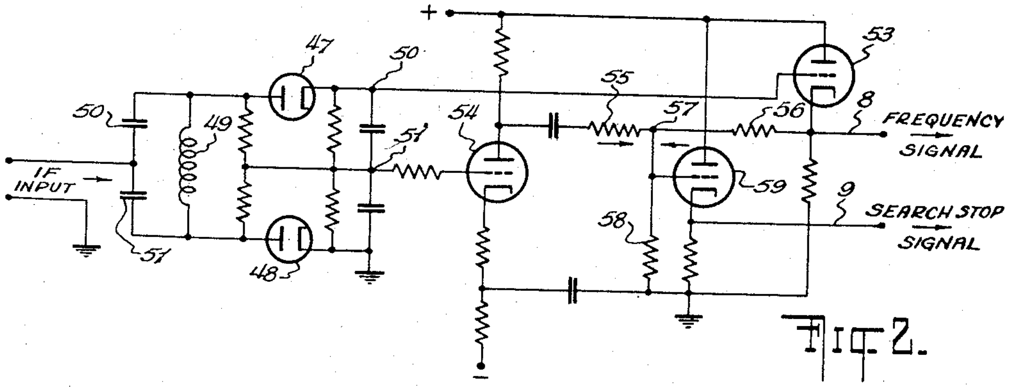
Fig. 2 is a circuit diagram of a discriminator-detector adapted for use as one of the elements of the system of Fig. 1.

Fig. 2 shows a suitable circuit for the discriminator-detector 7. A pair of diodes 47 and 48 are connected as shown to a network including an inductance 49 and capacitors 50 and 51 to form a conventional type of discriminator circuit. The particular discriminator shown here is the Weiss circuit, which is shown and described on pages 303 through 312 of Microwave Mixers, by Pound (vol. 16 of the Radiation Laboratory Series, published 1948 by McGraw-Hill Book Co., Inc.). Other types of discriminators, such as those shown in Figs. 7.7(*a*) and (*b*) on page 303 of the above publication, could be used.

Two output connections are made to the discriminator, one at the point 50, where the voltage magnitude and polarity varies as shown in Fig. 3, and the other at the point 51, where voltage varies substantially like the negative going loop of Fig. 3, as represented in Fig. 4. The point 50 is connected to the grid of a cathode follower amplifier 53, whose cathode is connected to the first output lead 8.

The point 51 is connected to the grid of a tube 54 provided with plate and cathode resistors so proportioned that it acts as an amplifier having a voltage gain of substantially two. Thus a negative-going variation of voltage at the grid of the tube 54 will produce a positive-going variation of twice the amplitude at the plate. This is represented by the curve of Fig. 5, where the variation of amplitude as a function of frequency is seen to be twice that at the point 51, shown in Fig. 4, and of opposite polarity.

The plate of the tube 54 and the cathode of the tube 53 are coupled through resistors 55 and 56 respectively to a junction point 57, which is returned to ground through a relatively low resistor 58. The point 57 is connected to the grid of a second cathode follower tube 59, whose cathode is connected to the second output lead 9.

The resistors 55, 56 and 58 act as a voltage summing network, whereby the voltage at the point 57 is proportional to the algebraic sum of the voltages represented by Figs. 3 and 5. The resultant voltage is represented by the graph of Fig. 6, and substantially the same voltage, at a lower impedance level, appears on the output lead 9.

While the above described circuit is designed for use with pulsed signals, it could be adapted for use with continuous wave signals by removing the blocking capacitors and providing D.-C. bias networks in accordance with known practice.

Figure 7:
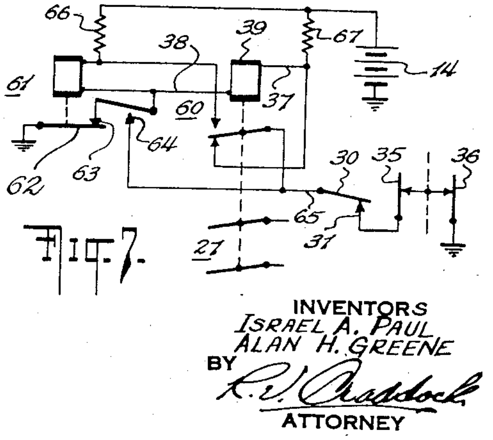
Fig. 7 is a circuit diagram of an alternately operating switching circuit adapted for use as one of the elements of the system of Fig. 1.

Fig. 7 shows a suitable arrangement for the alternately operating switching circuit 34. The electromagnet 39 that operates the reversing switch 27 is arranged to operate also a double throw switch contact assembly 60. An additional relay 61 is provided with contacts 62, 63 and 64, arranged as shown so that when the relay is deenergized, contacts 63 and 64 are connected together and contact 62 is disconnected from both 63 and 64; when the relay is energized, contact 63 is first connected to contact 62, then disconnected from contact 64 as long as the relay 61 remains energized.

Contact 64 and the moving arm of the switch 60 are connected to a lead 65, which goes to ground through the switch 30, 31 and limit switches 35 and 36. The upper terminal of electromagnet 39 and the coil of relay 61 are connected through resistors 66 and 67 to one terminal of the battery 14, and to the lower and upper fixed contacts respectively of the switch 60. The lower terminals of the relay coil and the electromagnet 39 are connected together to the relay contact 63. The movable relay contact 62 is grounded.

The alternately operating switching circuit of Fig. 7 is shown and described on pages 171 and 172 of The Design of Switching Circuits, by Keister, Ritchie and Washburn (The Bell Telephone Laboratories Series, published September 1951 by D. Van Nostrand Company, Inc.). The switch 60 and relay 61 correspond respectively to the relays Z and W in Figs. 8–29 of said publication, and the lead 65 of Fig. 7 corresponds to the lead P in said Figs. 8–29. Each time the lead 65 is disconnected from ground, the reversing switch is operated from its previous position to its other position. It will be apparent that the switch 27 could be operated directly by the relay 61 instead of the magnet 39, in which case the the reversing operation would occur each time the lead 65 is grounded. In either event, one reversal will take place each time the ground connection to the lead 65 is changed in one sense, for example opened, but not when it is changed in the opposite sense, for example closed.

Figure 8:
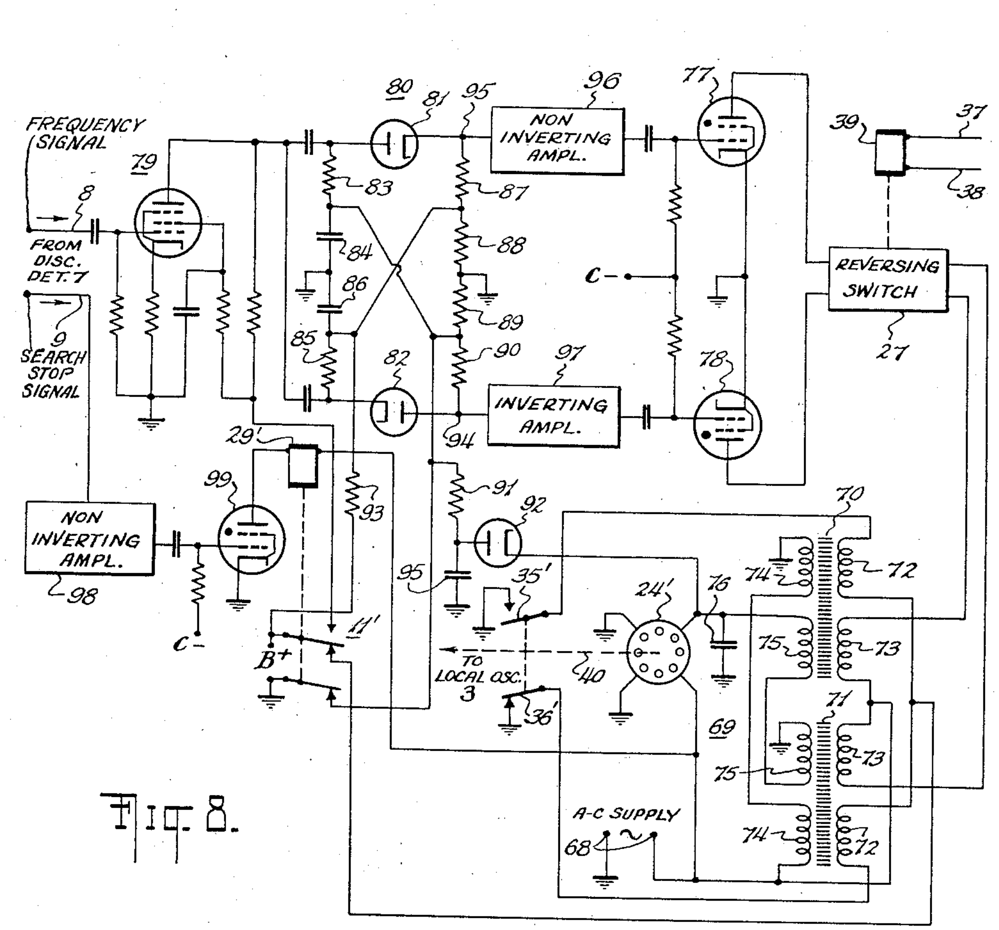
Fig. 8 is a circuit diagram showing details of a motor control system that is generally similar to the one in Fig. 1, but includes certain additional features adapting it particularly for use with pulsed signals and improving its stability.

In the modified system shown in Fig. 8, the motor 24' is a two phase induction motor, with one of its phase windings connected to the terminals 68 of an A.-C. supply source and the other arranged to be energized by a magnetic amplifier 69. The amplifier 69 is essentially a switching device that performs substantially the same functions as relays 21 and 22 in Fig. 1. It consists of two saturable core transformers 70 and 71, each provided with a pair of control windings 72 and 73, and a pair of power windings 74 and 75. The power windings 74 are primary, or power input windings, and they are connected in like sense to the A.-C. supply terminals 68. The power windings 75 are secondary, or power output windings, and they are connected in opposite senses to the second phase winding of the motor 24'.

When either of the control windings of one of the transformers 70 and 71 is supplied with direct current, the core of that transformer is saturated so that substantially no A.-C. power is transferred from the respective primary power winding 74 to the secondary winding 75. When neither core is saturated, both transformers operate but since their secondaries are connected in opposition the resultant is zero and the control phase winding of motor 24' is deenergized. Thus the control phase winding of motor 24' may be energized either in a first phase relationship to the A.-C. supply, or in the opposite phase relationship, by saturating either the core of transformer 70 or the core of transformer 71. A capacitor 76 is connected across the control phase winding to provide quadrature phase relationship between the currents in the two motor windings.

A pair of grid-controlled gas discharge tubes such as thyratrons 77 and 78 are connected as shown with their cathodes grounded and their anodes connected to one side of the reversing switch 27, which may be identical to the switch 27 of Fig. 1. The grids of tubes 77 and 78 are returned to a source of negative bias as indicated. The other side of the reversing switch 27 is connected to respective outside terminals of the control windings 73, the other terminals of windings 73 being connected together to the ungrounded A.-C. supply terminal.

Both tubes 77 and 78 are normally non-conducting. However, when a positive-going pulse of a sufficient amplitude reaches the grid of either tube during the part of the A.-C. cycle when the respective anode is positive, that tube becomes conductive and remains so throughout the remainder of the positive part of the A.-C. cycle. If the positive-going pulse at the grid is repeated at a rate substantially higher than the A.-C. supply frequency, the gas discharge tube fires every cycle and acts as a half-wave rectifier, drawing direct current through the control winding 73 that is connected to it and saturating the respective core.

Control input to the part of the system shown in Fig. 8 is taken from the output leads 8 and 9 of the discriminator-detector 7. Assuming the system is to be used for tuning a receiver of pulsed signals, the voltages on wires 8 and 9 will be pulsed, with amplitudes and polarities that vary with the I.-F. frequency as indicated in Figs. 3 and 6.

The discriminator output pulses appearing on wire 8 go to a pulse amplifier 79 which may be of conventional design as shown. Note that this amplifier also acts as a phase inverter, so that positive-going input pulses result in amplified negative-going output pulses, and vice versa. The output of amplifier 79 goes to a polarity selector circuit 80, which consists of a pair of diodes 81 and 82 connected oppositely as shown. The anode of diode 81 is returned to ground for pulse frequency signals by way of a resistor 83 and a by-pass condenser 84. The cathode of diode 82 is similarly returned to ground through a resistor 85 and a by-pass condenser 86.

The cathode of diode 81 is provided with a load comprising series-connected resistors 87 and 88, and the anode of diode 82 has a similar load comprising resistors 89 and 90. The junction between resistors 87 and 88 is connected across to that between resistor 85 and condenser 86, and the load resistor junction of diode 82 is similarly cross-connected to the input return circuit of diode 81. The latter point is also connected through a resistor 91 to the anode of a diode 92 which produces a dynamic dead-space bias as will be described. The other cross-connection point is connected through a resistor 93 to the positive terminal of a D.-C. power supply, designated B+.

Negative-going pulses reaching the polarity selector 80 will be blocked by the diode 81, but will cause current to flow through diode 82, producing similar negative-going pulses at the point 94. Similarly, positive-going input pulses will appear at the point 95 but not at point 94.

The resistors 93 and 88 form a voltage divider connected between the B+ terminal and ground, biasing the cathodes of both diodes 81 and 82 positive with respect to ground. This bias prevents either of the diodes from conducting unless the input pulses, positive or negative, have an amplitude in excess of the bias voltage. The effect is to produce a dead space in the response, similar to the dead space described in connection with the relays 21 and 22 of Fig. 1.

The resistors 91 and 89 form another voltage divider connected between the anode of diode 92 and ground. The cathode of diode 92 is connected to the ungrounded terminal of the control phase winding of the motor 24', and the diode acts as a rectifier to provide a negative D.-C. voltage proportional to the motor terminal voltage. A capacitor 95 is provided to smooth the rectified output and introduces some delay in variations of the D.-C. voltage caused by variations in the motor terminal voltage.

The D.-C. voltage derived from diode 92 biases the anodes of both diodes 81 and 82 negative with respect to ground. This bias is cumulative in effect to the fixed dead space bias applied to the cathodes, so that the overall dead space is increased when the motor 24' is energized for operation in the fine tuning phase.

Positive-going pulses appearing at the point 95 are applied to the grid of the gas discharge tube 77 by way of a non-inverting pulse amplifier 96. The amplifier 96 may consist of two or any even number of stages similar to the amplifier 79, whereby a positive-going input pulse will result in an amplified negative-going output pulse.

Negative-going pulses appearing at the point 94 are applied to the grid of tube 78 by way of an inverting pulse amplifier 97. This amplifier is similar to the amplifier 96, but contains an odd number of stages, whereby a negative-going input pulse will result in an amplified positive-going output pulse. The amplifier 97 is designed to have substantially the same gain as amplifier 96, notwithstanding the difference in number of stages.

The positive-going detector output pulses appearing on the wire 9 from discriminator-detector 7 are applied by way of a non-inverting pulse amplifier 98 to the grid of a gas discharge tube 99. The tube 99 is biased like tubes 77 and 78, and its plate is connected through an electromagnet coil 29' to the A.-C. supply. The coil 29' is associated with a switch assembly 11' to perform substantially the same functions as coil 29 and switch 11 in Fig. 1. The upper part of switch 11' is arranged to connect the B+ terminal to the plate circuit of amplifier 79 when the coil 29' is energized, and to connect B+ to the control windings 72 of transformers 70 and 71 when the coil 29' is deenergized. The lower part of switch 11' shorts out the dynamic dead space bias produced by diode 92, when coil 29' is deenergized.

The D.-C. circuits of control windings 72 are arranged to be completed to ground through limit switches 35' and 36' coupled to the tuning drive means 40. The arrangement is such that switch 35' is open when switch 36' is closed, and vice versa. When the mechanism reaches one limit, the switch that was open is closed, and the one that was closed is opened. This arrangement causes the motor 24' to search back and forth between the two limits as long as the lower contacts of switch 11' remain closed.

The general operation of the system of Fig. 8 is substantially the same as that of the corresponding part of Fig. 1. The motor will run at full power to search until a signal is picked up in the band $f_1$ to $f_2$ of the discriminator detector. The detector output pulses, amplified by amplifier 98, fire the tube 99 repeatedly with each A.-C. cycle, energizing magnet 29' substantially continuously. The switch 11' opens its lower contacts, stopping the search phase of operation, and transfers B+ to the amplifier 79, starting the fine tuning phase.

Any error in excess of that determined by the static dead space will fire one of the tubes 77 and 78, saturating one of the transformers 70 and 71 to energize the motor 24'. This introduces the dynamic dead space bias by way of diode 92. If the error is large, the motor will run at full power. If the error is small, the motor energization will pulsate in the manner described in connection with Fig. 1, and the motor will run at reduced torque and speed. If the direction of rotation is such as to reduce the error, the motor will run to adjust the I. F. frequency to some point within the range corresponding to the static dead space, then stop. If the motor starts in the wrong direction, the magnet 29' will be deenergized and the reversing switch 27 operated as described with reference to Fig. 1, causing the motor 24' to restart toward the null position.

Since most of the necessary gain in the system of Fig. 8 is provided at pulse signal frequencies by amplifiers 79, 96 and 97, the only zero drifts that can occur must arise in the magnetic amplifier, where they can be kept so low as to be insignificant.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. In a radio system that includes a local oscillator and a mixer, said mixer being responsive to received signals and to said local oscillator to produce an I.-F. signal, said local oscillator having mechanically operable tuning means: apparatus for automatically tuning said oscillator to adjust said I.-F. signal to a predetermined frequency, comprising discriminator-detector means adapted to provide a first output voltage of magnitude and polarity that depend upon the extent and direction respectively of deviation of the frequency of said I.-F. signal from said predetermined frequency within an operating range of frequency deviation, and a second output voltage of constant polarity and of a magnitude substantially independent of frequency only when said I.-F. signal frequency is within said range, both of said output voltages being substantially zero when said I.-F. signal frequency is outside said range, a reversible motor coupled to the mechanically operable tuning means of said oscillator, means for normally energizing said motor to drive said tuning means in search operation continuously and alternately from one extreme of its operating range to the other, said energizing means being connected to said discriminator-detector means and responsive to said second output voltage to stop said search operation and energize said motor in response to said first output voltage in one sense relationship between the polarity of said first output voltage and the direction of rotation of said motor, and means responsive to said second output voltage to reverse said sense relationship each time the magnitude of said second output voltage decreases substantially to zero.

2. The invention set forth in claim 1, wherein said motor energizing means includes a reversing switch having input and output terminals, said input terminals being adapted to be connected to a power supply source, two further switch devices connected between said reversing switch output terminals and said motor and adapted when operated to connect said motor respectively in opposite senses to the output terminals of said reversing switch, polarity-responsive means for selectively operating one of said further switches in response to a voltage of one polarity and the other of said further switches in response to a voltage of opposite polarity, a source of substantially fixed bias voltage, third further switch means for selectively connecting said polarity responsive means to be actuated by said first output voltage of said discriminator-detector means and said fixed bias voltage, means for operating said reversing switch from one of its positions to the other, said reversing switch operating means including an alternately operating switching circuit, means including a fourth further switch for actuating said alternately operating switching circuit, and means connected to said discriminator-detector and responsive to said second output voltage to operate said third switch to apply said first output voltage to said polarity responsive means when said second output voltage is substantially greater than zero, and to operate said fourth switch to actuate said alternately operating switching circuit each time said second output voltage changes in one sense between substantially zero and a value substantially greater than zero.

3. The invention set forth in claim 2, wherein said first mentioned two further switch devices comprise saturable core transformers and grid-controlled gas discharge tubes connected to said transformers for saturating the cores thereof when said tubes are conductive.

4. The invention set forth in claim 2, wherein said polarity responsive means comprises a pair of oppositely connected rectifiers and means for supplying a bias voltage to said rectifiers to create a dead space region in their operating characteristic, whereby neither of said rectifiers conducts when the magnitude of the input voltage to said polarity responsive means is less than a value determined by that of said bias.

5. The invention set forth in claim 2, further including means for reducing the sensitivity of said polarity responsive means when said motor is energized in response to said first output voltage of said discriminator-detector.

6. The invention set forth in claim 4, further including means for applying an additional bias voltage to said rectifiers, and means for deriving said additional bias from the terminal voltage of said motor.

7. The invention set forth in claim 6, wherein said motor is an A.-C. motor and last mentioned means includes a rectifier connected between said motor and said polarity responsive device.

8. The combination set forth in claim 1, wherein said discriminator-detector means comprises a frequency discriminator that includes resonant circuit means and two rectifiers connected thereto to provide respectively a first voltage of one polarity in response to input signals of frequencies below a predetermined frequency and a second voltage of opposite polarity in response to input signals of frequencies above said predetermined frequency, a first output terminal connected to both said rectifiers to provide a frequency-responsive reversible polarity output voltage that is a composite of said first and second voltages, a polarity-changing amplifier having a gain of substantially two connected to one of said rectifiers to provide a third voltage that corresponds to only one of said first and second voltages but is of opposite polarity and twice the magnitude thereof, and a second output terminal coupled to said first output terminal and to said amplifier to provide a second output voltage of non-reversing polarity and of a magnitude that is substantially independent of frequency throughout a frequency range that includes said predetermined frequency.

9. The invention set forth in claim 4, wherein said local oscillator further includes voltage-responsive tuning means, a voltage source connected to said last means, and means responsive to said first output voltage of said discriminator-detector to adjust the voltage of said source and thereby tune said oscillator throughout a range that is approximately equal to the range corresponding to said dead space region in the characteristic of said polarity responsive means.

References Cited in the file of this patent

UNITED STATES PATENTS

| | | |
|---|---|---|
| 2,263,633 | Koch | Nov. 25, 1941 |
| 2,296,092 | Crosby | Sept. 15, 1942 |
| 2,369,542 | Dietrich | Feb. 13, 1945 |
| 2,420,230 | Crosby | May 6, 1947 |
| 2,499,584 | Hills | Mar. 7, 1950 |
| 2,513,786 | Crosby | July 4, 1950 |
| 2,525,442 | Bischoff | Oct. 10, 1950 |
| 2,783,383 | Robins | Feb. 26, 1957 |
| 2,798,150 | Tate | July 2, 1957 |